(12) United States Patent
Alvandpour et al.

(10) Patent No.: US 6,633,190 B1
(45) Date of Patent: Oct. 14, 2003

(54) MULTI-PHASE CLOCK GENERATION AND SYNCHRONIZATION

(75) Inventors: Atila Alvandpour, Portland, OR (US); Daniel Eckerbert, Ravlanda (SE); Ram K. Krishnamurthy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/133,980

(22) Filed: Apr. 26, 2002

(51) Int. Cl.[7] ................................................ G06F 1/04
(52) U.S. Cl. .................. 327/291; 327/149; 327/158; 327/163
(58) Field of Search .................... 327/291, 2, 3, 327/7, 12, 42, 141, 144, 147, 149, 150, 156–161, 162, 163, 293, 294, 299, 379; 326/93; 375/354, 375; 331/15, 28, 1 R (56) References Cited

U.S. PATENT DOCUMENTS

| | | | | |
|---|---|---|---|---|
| 5,379,002 A | * | 1/1995 | Jokura | 331/10 |
| 5,550,860 A | * | 8/1996 | Georgiou et al. | 375/220 |
| 5,621,771 A | * | 4/1997 | Dvir | 375/354 |
| 6,239,634 B1 | * | 5/2001 | McDonagh | 327/158 |
| 6,281,726 B1 | * | 8/2001 | Miller, Jr. | 327/156 |
| 6,281,728 B1 | * | 8/2001 | Sung | 327/158 |
| 6,289,068 B1 | * | 9/2001 | Hassoun et al. | 375/376 |
| 6,326,826 B1 | * | 12/2001 | Lee et al. | 327/161 |
| 6,337,590 B1 | * | 1/2002 | Millar | 327/158 |
| 6,441,667 B1 | * | 8/2002 | Boerstler et al. | 327/295 |
| 6,452,431 B1 | * | 9/2002 | Waldrop | 327/158 |
| 6,504,408 B1 | * | 1/2003 | von Kaenel | 327/158 |

OTHER PUBLICATIONS

Wu et al., A Low–Jitter Skew–Calibrated Multi–Phase Clock Generator for Time–Interleaved Applications, Feb. 2001, Digest of Technical Papers, ISSCC, IEEE International Solid–State Circuits Conference, pp. 396–397, 470.

Minami et al., A 1GHz Portable Digital Delay–Locked Loop with Infinite Phase Capture Ranges, Feb. 2000, Digest of Technical Papers, ISSCC, IEEE International Solid–State Circuits Conference, pp. 350–351, 469.

Garlepp et al., A Portable Digital DLL for High–Speed CMOS Interface Circuits, May 1999, IEEE Journal of Solid–State Circuits, vol. 34, No. 5, pp. 632–644.

Yamaguchi et al., 2.5GHz 4–phase Clock Generator with Scalable and No Feedback Loop Architecture, Feb. 2001, Digest of Technical Papers, ISSCC, IEEE International Solid–State Circuits Conference, pp. 398–399.

* cited by examiner

Primary Examiner—Timothy P. Callahan
Assistant Examiner—Hai L. Nguyen
(74) Attorney, Agent, or Firm—Fish & Richardson P.C.

(57) ABSTRACT

A method for controlling a local clock includes receiving a reference clock and generating a phase-shifted version of the reference clock. The two clocks are synchronized using a closed-loop method that produces a control signal. The control signal is smoothed during the closed-loop method and the smoothed signal is then used, instead of the control signal, in generating the phase-shifted clock.

27 Claims, 6 Drawing Sheets

MULTI-PHASE CLOCK GENERATION AND SYNCHRONIZATION

TECHNICAL FIELD

This invention relates to circuit design, and more particularly to the low-noise generation and synchronization of multiple phases of a reference clock.

BACKGROUND

A variety of devices, including, for example, circuit-level devices, integrated-circuit-level devices, board-level devices, and system-level devices, often need various phases of a reference clock. Known techniques for providing these phases include global generation and distribution, synchronization of locally generated phases using, for example, phase locked loops ("PLLs") or delay locked loops ("DLLs"), and feedback-free architectures.

DESCRIPTION OF DRAWINGS

Like reference symbols indicate like elements.

DETAILED DESCRIPTION

Systems and techniques for implementing multi-phase clocks are described below. Aspects of these techniques may include, without limitation, the low-noise generation and synchronization of various phases of a reference clock, a hybrid closed-loop/open-loop system to eliminate noise associated with the closed-loop system, an all-digital system for portability and ease of design, noise averaging to determine an open-loop operating point, using a long start-up time to improve performance, and eliminating noise from selected components.

Figure 1:
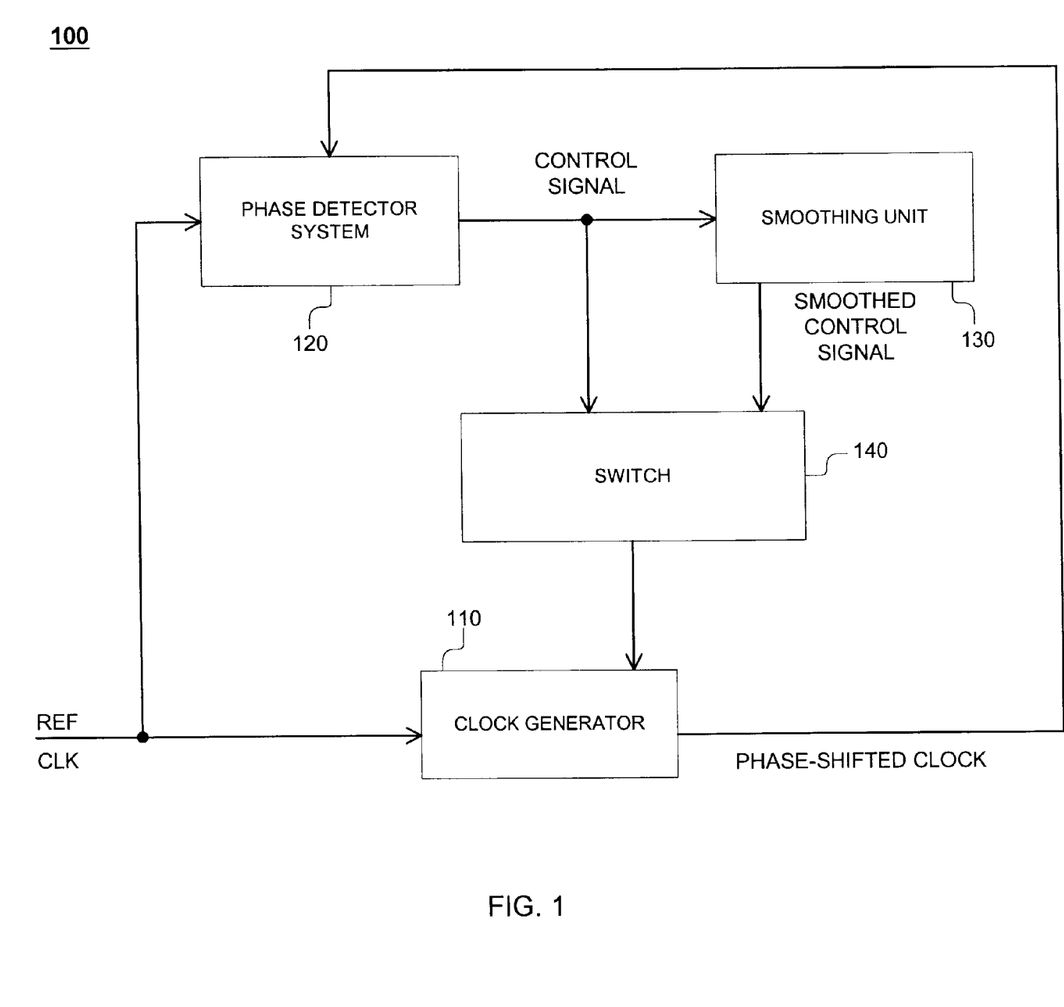
FIGS. 1–3 are block diagrams of multi-phase clock generators.

FIG. 1 shows a multi-phase clock generator 100. Though the clock generator 100 and those of subsequent figures can be applied to both analog and digital signals, they are particularly described with respect to digital signals.

The multi-phase clock generator 100 includes a clock generator 110 that generates a phase-shifted version of an input reference clock. This generation can be accomplished in a variety of ways including, without limitation, the use of a delay line. Thus, the generation performed by the clock generator 110 refers principally to the generation of phase delay, with the input clock propagating through clock generator 110. A delay line may be implemented in any known manner, including the use of a series of inverters.

A phase detector system 120 receives as input both the reference clock and the phase-shifted version of the reference clock. The phase detector system 120 then produces a control signal indicative of the phase difference between the two input signals. The phase detector system 120 may be implemented using well-known digital phase detection techniques.

A smoothing unit 130 receives the control signal. In general, it is only necessary that the smoothing unit 130 be coupled to the phase detector system 120, as opposed to being directly connected to it. The term "coupled" is hereby defined to allow the insertion of one or more components between the two coupled devices. Even without the insertion of another component, the connection would ordinarily use a wire, a trace, free space, or another path that could be referred to as a component with specific electric properties and characteristics. In FIG. 1, however, the smoothing unit 130 is not only coupled to, but also directly connected to, the phase detector system 120, from which the smoothing unit 130 receives the control signal.

The smoothing unit 130 smoothes the control signal and produces a smoothed control signal. Smoothing a signal refers generally to filtering the signal. More particularly, smoothing the signal may refer to averaging the signal. Digital signals may be averaged in many known ways, and the implementation will vary depending on the nature of the information conveyed by the control signal. If the control signal conveys information on the magnitude of the phase difference between the measured signals, then smoothing unit 130 may simply add a series of values and divide. Alternatively, the averaging may involve weighting successive control signal inputs differently. For example, the smoothing unit 130 may ignore a series of inputs, then accept one or more inputs, and, after repeating this process multiple times, average the "sampled" inputs. This sampling method effectively assigns many control signal inputs a weight of zero. Other weights may be used when warranted by a particular application.

In one implementation, the smoothing unit 130 is designed to produce a constant value rather than a dynamic value. Alternate implementations may retain the static nature of the smoothed control signal, but periodically generate a new static smoothed control signal. Other implementations may produce dynamic values, such as a moving window weighted average, a regularly sampled value, or some other dynamic smoothed signal.

The switch 140 receives both the control signal and the smoothed control signal and selectively outputs one of these signals. The switch 140 may be implemented in a variety of known ways, such as, for example, by a multiplexer or a series of logic gates. The output of the switch 140, which goes to the clock generator 110, determines the amount of phase shift produced, or generated, by the clock generator 110. In one implementation that uses a constant, or static, smoothed control signal, the system is switched from a closed-loop operation to an open-loop operation when switch 140 switches from the dynamic control signal to the smoothed control signal.

Figure 3:
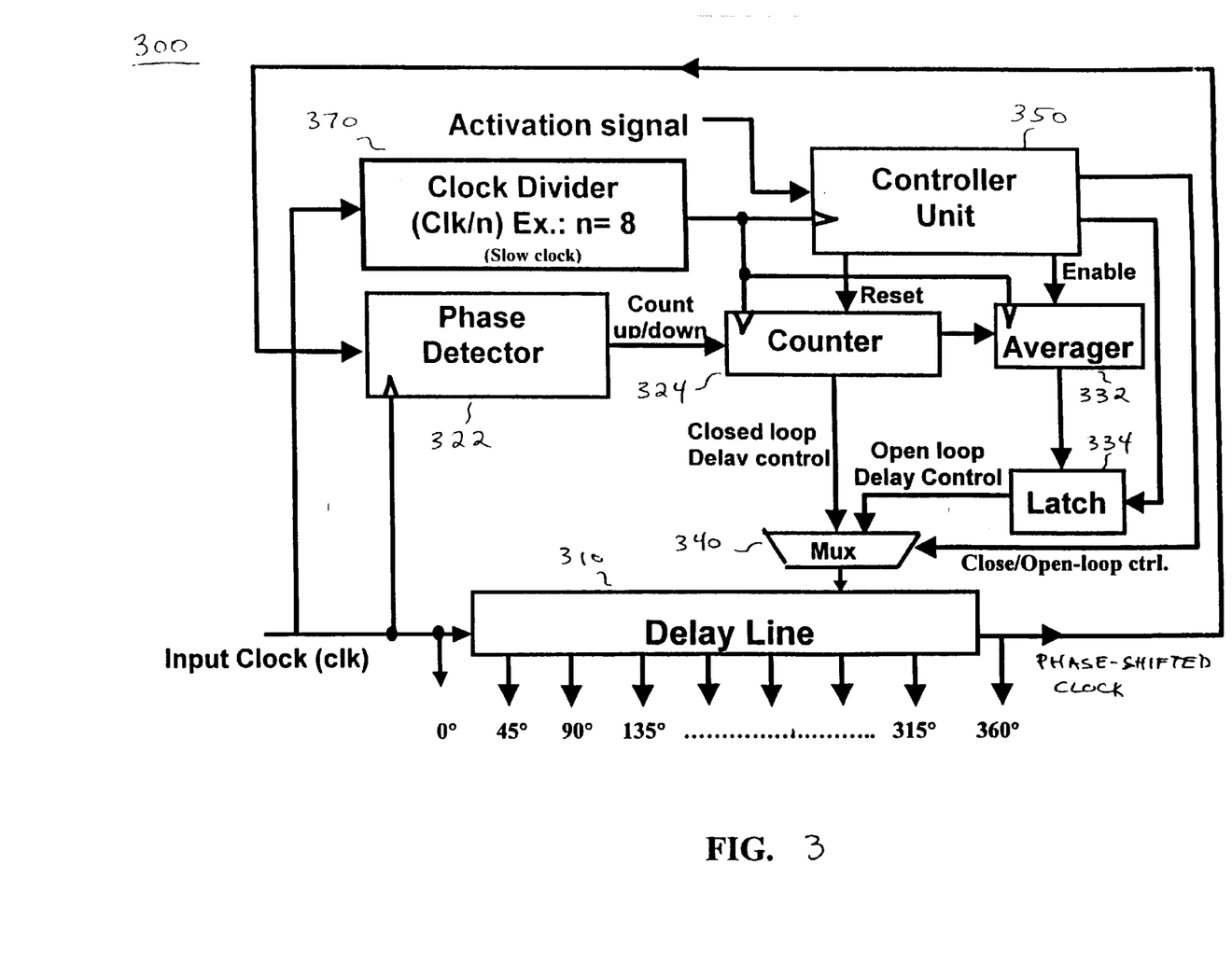

Ignoring for the moment smoothing unit 130, FIG. 1 will be seen to implement a closed-loop phase synchronization system. When the closed-loop system locks, the output of clock generator 110 is phase-aligned with the reference clock. One implementation of this is shown in FIG. 3, where Clock Generator 110 is implemented with a delay line and various equally-spaced phases are tapped off of the delay line. This implementation is described in more detail in the discussion of FIG. 3 below.

Such a closed-loop system is limited by the existence of noise. There are a variety of noise sources and mechanisms. For example, noise is created from, or passed through, a number of sources, including phase detectors. Noise on the supply voltage, for example, may be passed through onto the output of a phase detector. This noise can be reduced by various techniques, but not eliminated.

Another source of noise arises from phase dithering. Even a system in lock will periodically migrate up and down. This is true for analog and digital designs. The phase changes on the phase-shifted clock are referred to as phase jitter, or simply jitter, and the process of migrating up and down is referred to as dithering around the lock. In a digital system, the jitter is also referred to as quantization noise, quantization error, or bang-bang error because of the minimum step size imposed by quantization.

There is a minimum step size because digital phase-shifters can only change phase in fixed amounts. Any given digital phase shifter can only change its phase over a given range in a discrete number of steps. The range and the number of steps are fixed by the design of the phase shifter. For example, a five-bit phase shifter can have 32 steps over its phase range. Thus, the minimum step size, at least in a linear phase shifter, is equal to the range divided by the number of steps available. Even if the phase-shifter is non-linear, it is still characterized by a minimum phase step-size. Thus, whenever the phase-shifter is instructed to change the phase delay, there will be a jump in phase. Step jumps in phase introduce noise onto the clock and can cause problems for devices tracking the phase. These problems impose design limitations on, for example, the speed at which clocks can run, and limit a system's robustness.

The problem of dithering is exacerbated by typical digital phase detectors that supply only an up/down signal indicating which way the digital phase-shifter should move the phase. These phase detectors do not have a mechanism for telling the phase shifter to stay still. Thus, dithering is not merely a periodic occurrence but a constant problem.

In contrast, the implementation 100 of FIG. 1 eliminates phase dithering and the associated jitter by switching to an open-loop system after phase lock has been achieved. Smoothing unit 130 averages the control signal, which correlates with averaging the dithering. In so doing, a stable operating point is determined. In addition, by switching to an open-loop system, phase detector system 120 is removed from the loop, which inhibits noise from passing through phase detector system 120 onto the phase-shifted clock.

Figure 2:
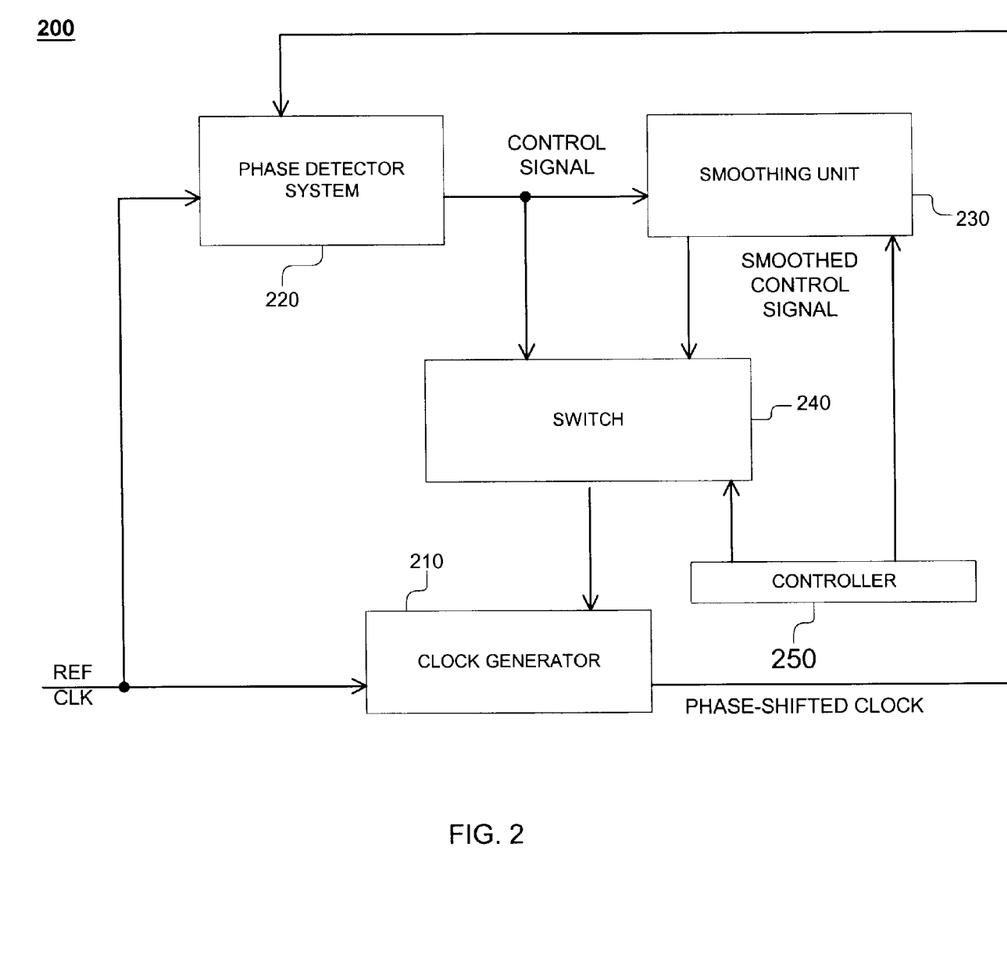

FIG. 2 illustrates a multi-phase clock generator 200 having elements similar to elements of the multi-phase clock generator 100 of FIG. 1. In particular, elements 210, 220, 230, and 240 in FIG. 2 correspond to elements 110, 120, 130, and 140, respectively, in FIG. 1. The multi-phase clock generator 200 adds a controller 250 that controls various functions of smoothing unit 230 and switch 240. Controller 250 may perform a variety of control functions associated with smoothing unit 230, such as, for example, enabling, disabling, latching the result, and resetting. Controller 250 may also perform a variety of control functions associated with switch 240, such as, for example, selecting which input to pass through to the output.

FIG. 3 shows a more detailed implementation 300 of the multi-phase clock generator 200 of FIG. 2. In FIG. 3, elements similar to those in FIG. 2 are indicated with similar references. Accordingly, elements 310, 340, and 350 correspond to elements 210, 240, and 250, respectively, of FIG. 2; elements 322 and 324 correspond to element 220 of FIG. 2; and elements 332 and 334 correspond to element 230 in FIG. 2. Although the elements correspond, they are not necessarily identical.

Clock generator 210 in FIG. 2 is implemented in FIG. 3 by a delay line 310. Delay line 310 has nine taps, including the ones at both ends, providing nine signals that have equally spaced phases. That is, each of the signals is separated by 45 degrees of phase.

Phase detector system 220 in FIG. 2 is implemented in FIG. 3 by a phase detector 322 and a counter 324. Thus, the control signal in FIG. 2 corresponds most directly to the output of the counter 324 in FIG. 3. FIG. 3 notes that the output produced by phase detector 322 is an up/down signal. The up/down signal is a binary signal that indicates only whether the first input signal leads or lags the second input signal. This signal thus provides no direct information on the magnitude of the phase difference, although in other implementations such information could be provided.

The multi-phase clock generator 300 also includes a clock divider 370 that simply divides the reference, or input, clock by eight. Alternate implementations need not divide the reference clock or may divide it by any other suitable number. The general purpose of clock divider 370 is to slow down the feedback system. This allows more time for the delay line 310 to respond to a change on its input, and for phase detector 322 to respond to the subsequent change on its input before again providing feedback to the delay line 310. The mechanism for slowing down the feedback is further described in the discussion of the other elements below.

Counter 324 provides the magnitude information not captured directly by the phase detector 322. Counter 324 does this by counting, as directed by the up/down signal received from phase detector 322. Counter 324 outputs a running count, based on the up/down input from phase detector 322. Counter 324 is used because delay line 310, in the implementation of FIG. 3, requires an absolute input. That is, delay line 310 is looking for a number, and not merely an indication that the phase delay must be increased or decreased. In one implementation, delay line 310 accepts five bits of input to provide 32 different values of phase delay. Although counter 324 has been described as being part of the phase detecting operation, it can also be conceived of as a separate element, or as part of the smoothing function. Further, alternate implementations need not employ a counter but could simply provide, for example, up/down information as input to an appropriately-designed clock generator and smoothing unit.

Counter 324 also contributes to the slowing of the feedback loop. Counter 324 is clocked by the output of clock divider 370, and therefore only responds to every eighth up/down signal from phase detector 322. As mentioned earlier, by ignoring seven up/down signals, counter 324 gives delay line 310 and phase detector 322 more time to respond to a change on their inputs.

Smoothing unit 230 of FIG. 2 is implemented in FIG. 3 with the combination of averager 332 and latch 334. Averager 332 is also clocked by the slower clock from clock divider 370. As a result, averager 332 only looks for a new input when counter 324 is clocked. In one implementation, averager 332 averages the output from counter 324 over 128 cycles. Other implementations may use more or less than 128 cycles. Such a design choice may be influenced by, for example, the noise characteristics, the accuracy desired for the application, and the available time for averaging. In the implementation of FIG. 3, averager 332 can be referred to as a digital averaging unit and can be implemented with a processor, an add-and-divide circuit, a programmable array, or one of myriad other techniques known in the art.

By ignoring seven up/down signals, counter 324 effectively performs a weighting operation. Because the weights associated with the seven ignored up/down signals are zero, counter 324 could also be described as performing a sampling function. These weighting and sampling operations can be considered to be smoothing, or filtering, operations. Thus, as suggested above, counter 324 could be conceived of as performing part of the smoothing function.

Analogously, the control signal in FIGS. 1 and 2 could correspond in FIG. 3 to either the up/down signal or the output of counter 324.

Switch 240 in FIG. 2 is implemented in FIG. 3 by mux (or multiplexer) 340. The operation of a mux is well known, as are other implementations of its function.

Despite the sampling in the implementation of FIG. 3, indeed despite its digital nature, there is regular feedback when the mux 340 selects the output of counter 324. Thus, the term closed-loop is used to describe the operation. Other terms may focus attention on the non-continuous nature of this feedback, such as digital closed-loop, sampled closed-loop, or delayed closed-loop. For simplicity, however, all of these systems are referred to as closed-loop systems.

Controller unit 350 in FIG. 3 differs from controller 250 in FIG. 2 in that more control signals are specified. Controller unit 350 provides an enable to averager 332, a latch control signal to latch 334, a selection signal to mux 340, and a reset to counter 324. Controller unit 350 is activated by the activation signal, and the sequence of events that takes place after receiving an active activation signal are described in relation to FIG. 6 below. Controller unit 350 also operates on the slower clock produced by clock divider 370. FIG. 3 is not a schematic and does not attempt to show all of the control signals that would be necessary in an implementation.

Delay line 310 uses, in a direct manner, the output of mux 340 to generate the phase-shift of the phase-shifted clock. Delay line 310 can also be said to use, in an indirect manner, the up/down signal from phase detector 322 when operating in closed-loop mode. Such use is termed indirect because the up/down signal is processed by counter 324 before reaching delay line 310.

Figure 4:
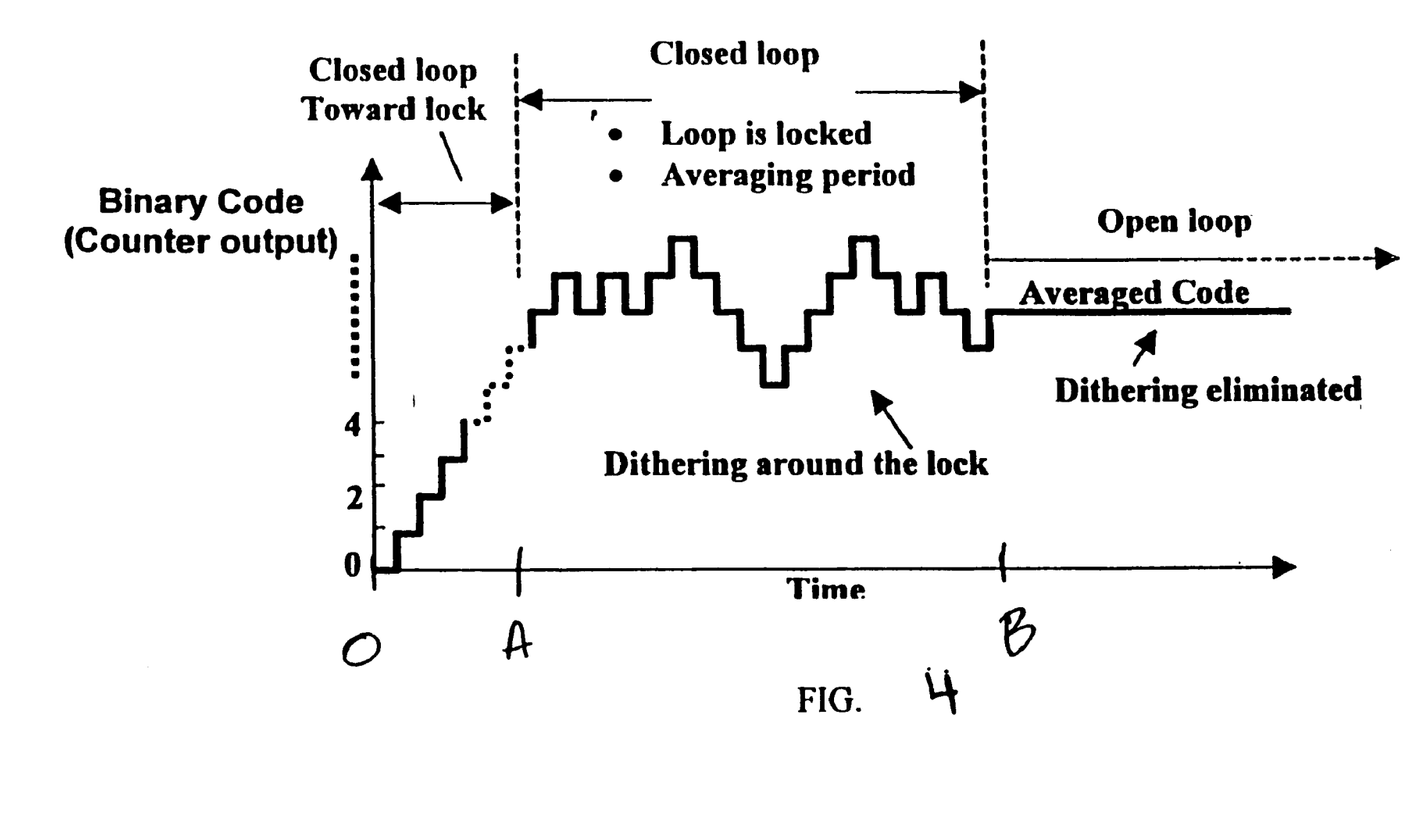
FIG. 4 is a timing diagram associated with the implementation of FIG. 3.

FIG. 4 provides a timing diagram 400 associated with the implementation of FIG. 3. Beginning at time zero, the system is activated by bringing the activation signal to its active state. This may be triggered, for example, when a system's power is turned on or when the frequency of the reference clock changes. Controller unit 350 then resets counter 324 and directs mux 340 to select the output from counter 324.

By directing mux 340 to select the output from counter 324, the system is put into a closed-loop operation to acquire phase lock. By also resetting counter 324, delay line 310 is given an input of all zeros on its five input bits. In one implementation, an input of all zeros to delay line 310 causes its output, the phase-shifted clock, to lead the input reference clock at phase detector 322.

With the phase-shifted clock leading the reference clock, phase detector 322 outputs an "up" on its up/down signal, indicating that the phase delay of the phase-shifted clock must be increased. Using the slower clock, counter 324 acknowledges every eighth signal from phase detector 322 and begins to increment its count in response to receiving the "up" signal. The vertical axis of FIG. 4 reflects the output of counter 324, and this incrementing is shown beginning at time zero and continuing until time A. At time A, the phases of the two clocks are substantially phase-aligned and the system is locked.

The closed-loop system begins to dither around the lock, as indicated between times A and B in FIG. 4. At time A, controller unit 350 enables averager 332 which averages the output of counter 324. As mentioned earlier, in one implementation the output of counter 324 is averaged by averager 332 for 128 periods of the slow clock. At time B, the average value has been obtained and controller unit 350 directs latch 334 to latch the fixed average value. Controller 350 then directs mux 340 to pass the latched average value to delay line 310.

As indicated in FIG. 4, after time B the system is in an open-loop operation using the constant, or static, average value. All of the phase dither attributable to the digital nature of the synchronizing technique has been removed. The system can continue to operate in this open-loop mode indefinitely. As long as the frequency is not changed, the system should not lose its phase-lock and, accordingly, should not need to resynchronize using the closed-loop operation. Further, in another implementation the fixed average value could be stored so that after a system reset the system could go immediately into the open-loop operation without having to recompute the average value. Appropriate safeguards could be built into the system to ensure that the fixed average value was still an appropriate open-loop operating point.

Figure 5A:
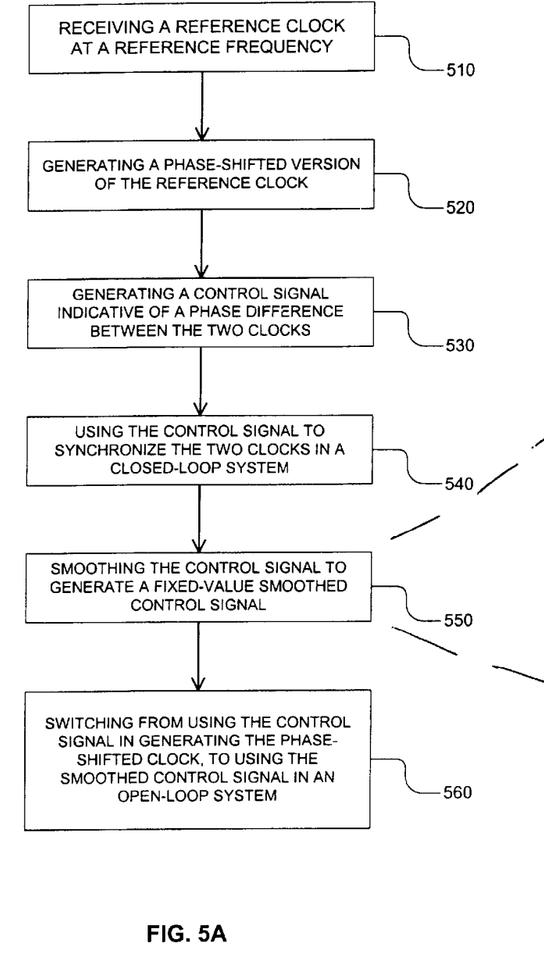
FIGS. 5A, 5B, and 6 are flow charts of procedures for generating multi-phase clocks.

FIG. 5A is a flow chart of a procedure 500 for generating multi-phase clocks. A reference clock, operating at a specific reference frequency, is received (510) and a phase-shifted version of the reference clock is generated (520). A control signal is then generated that is indicative of the phase difference between these two clocks (530) and the two clocks are phase-synchronized using the control signal in a closed-loop system (540). Recall that the two clocks are already operating at the same frequency. Other implementations may also perform frequency synchronization if the two clocks are not at the same frequency initially.

The control signal is then smoothed to generate a fixed-value smoothed control signal (550). The system is then switched to an open-loop system using the fixed-value smoothed control signal to control the phase shift of the phase-shifted clock (560).

Figure 5B:
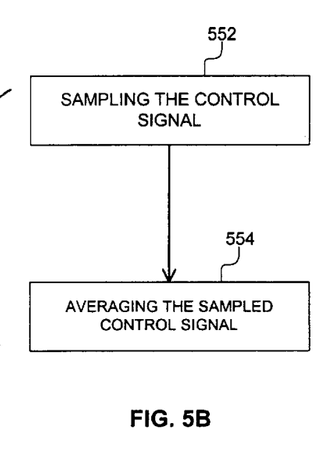

FIG. 5B is a flow chart of an expansion of the smoothing function of step 550 in FIG. 5A. The control signal is first sampled (552) and then the sampled control signal is averaged (554). Considering the control signal in this process to be the up/down signal produced by phase detector 322 in FIG. 3, process step 552 in FIG. 5B correlates with the sampling function performed by counter 324 in FIG. 3, and process step 554 in FIG. 5B correlates with the averaging function performed by averager 332 in FIG. 3. Other implementations of the smoothing function of step 550 in FIG. 5A are possible and are within the level of ordinary skill in the art.

Figure 6:
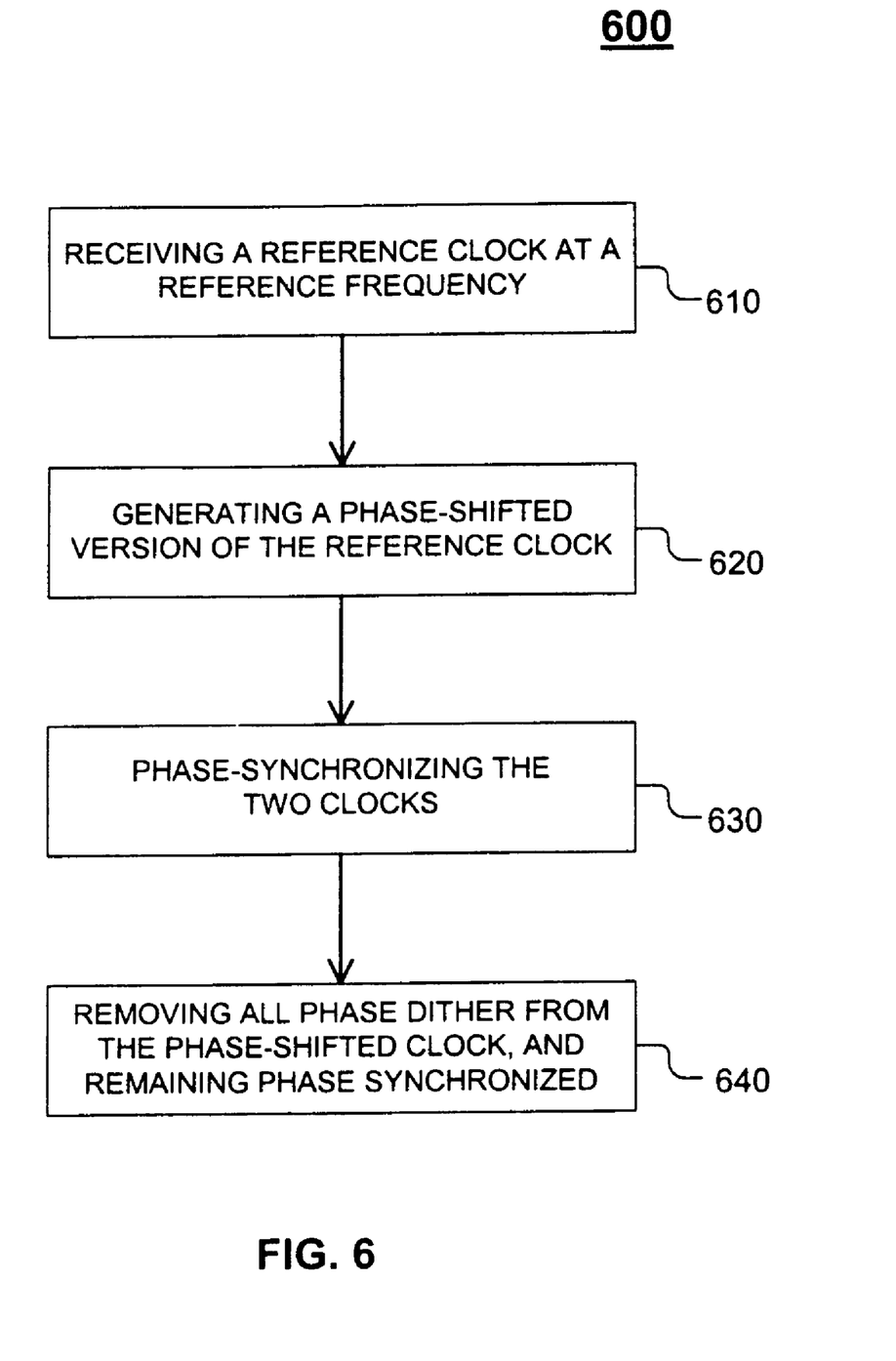

FIG. 6 is a flow chart of another procedure 600 for generating multi-phase clocks. A reference clock, operating at a specific reference frequency, is received (610) and a phase-shifted version of the reference clock is generated (620). The two clocks are then phase-synchronized (630). The technique may be, for example, the digital closed-loop technique described in FIG. 3, or an analog variation thereof.

As described earlier, after phase-lock, a system will dither around that lock and produce noise that is particularly problematic for digital systems. However, in the process 600 of FIG. 6, all phase dither is removed from the phase-shifted clock and the phase-shifted clock remains phase-synchronized with the reference clock (640). Digital phase dither may be removed, for example, using the implementation described in FIGS. 3 and 4. Analog phase dither may be removed, for example, using an analog variation of that implementation. Additionally, the two clocks can remain phase-synchronized in process step 640 by using, for example, the implementation of FIG. 3 to retain phase synchronization during the open-loop operation by virtue of having the smoothing function determine a stable operating point.

Implementations have been described that provide, for example, an all-digital solution for generating and synchronizing multiple phases of a reference frequency. The digital nature of the solution provides ease of design and portability, making it simple to use and incorporate the design in a variety of systems. One application that this solution is well-suited for is the design of processors. The implementation of FIG. 3 has been implemented using 180 nm technology, which is suitable for processors.

In a processor environment, a longer start-up time can be tolerated because a processor system typically remains in operation at a stable frequency for an operationally long period of time. An operationally long period of time is a length of time that is long enough so that the smoothing time is insignificant in comparison. Such systems are said to be insensitive to start-up time, or start-up time delays. As an example, it is common for office workers to turn their computers on when they arrive in the morning and to leave them running throughout the day. For such users, the start-up time is only incurred once per eight hours of use, and lengthening it to allow the smoothing operation will not noticeably degrade efficiency. Thus, the overhead of determining a stable, static operating point for open-loop operation can be tolerated.

One implementation may be used with the example of the office worker's personal computer. In such an implementation, after a stable open-loop operating point is determined, the processor remains in open-loop mode for the duration of operation. That is, the processor does not lose lock during the course of the worker's day due to frequency or phase instability on the reference clock.

The processor environment is also characterized by fixed-length stable communication paths. As opposed to free-space communications and cellular applications, for example, processor communication paths do not vary in length or frequency characteristics over operationally significant periods of time. Thus, once lock is achieved, the system generally remains in lock for the duration of operation. Even component aging is seldom a problem because the change in frequency or other characteristics occurs over long periods of time and not, for example, during the course of a day.

The noise reduction in the implementations described increases a system's robustness and allow higher speed clocks to be used. This allows, for example, faster microprocessors.

Implementations may involve a DLL, a PLL, or some other system embodying one or more features described. A DLL, PLL, or other system may include digital and/or analog components.

A number of implementations have been described. Nevertheless, it will be understood that various modifications may be made without departing from the spirit and scope of the claims. For example, as suggested throughout the description, the implementations described also apply to analog signals. Analog implementations could use analog phase discriminators, delaying devices, integrators, filters, and other known analog devices and methods. For example, an analog integrator may be employed to average the control signal. Accordingly, other implementations are within the scope of the following claims.

What is claimed is:

1. A method of controlling a local clock, the method comprising:
   receiving a reference clock at a reference frequency;
   generating a phase-shifted version of the reference clock;
   synchronizing the reference clock and the phase-shifted version of the reference clock using a closed-loop method that generates a control signal;
   smoothing the control signal during a period of the operation of the closed-loop method to produce a smoothed control signal;
   switching from the closed-loop method to an open loop method after smoothing the control signal; and
   using the smoothed control signal, instead of the control signal, during at least a portion of the open loop method in generating the phase-shifted version of the reference clock.

2. The method of claim 1 wherein the control signal is a measure of a phase difference between the local clock and the reference clock.

3. The method of claim 2 wherein the control signal provides an indication of a direction of the phase difference.

4. The method of claim 2 wherein the control signal provides an indication of a magnitude of the phase difference.

5. The method of claim 1 wherein using the closed-loop method comprises employing a digital technique.

6. The method of claim 1 wherein using the closed-loop method comprises employing a delay locked loop.

7. The method of claim 1 wherein using the closed-loop method comprises employing an analog technique.

8. The method of claim 7 wherein employing the analog technique comprises using a phase locked loop.

9. The method of claim 1 wherein using the open loop method comprises employing a digital technique using a latch and a multiplexer.

10. The method of claim 1 wherein smoothing the control signal comprises averaging the control signal.

11. The method of claim 10 wherein averaging the control signal comprises employing an analog integrator.

12. The method of claim 10 wherein averaging the control signal comprises employing weighted averaging.

13. The method of claim 12, wherein:
   employing the weighted averaging comprises:
      sampling the control signal periodically, and
      averaging the sampled control signal; and
   using the smoothed control signal comprises using the averaged sampled control signal.

14. The method of claim 13, wherein using the closed-loop method comprises sampling the control signal and then generating the phase-shifted version of the reference clock using the sampled control signal.

15. The method of claim 1 wherein smoothing the control signal comprises smoothing a digital control signal across multiple values of the digital control signal.

16. A clock system comprising:
   a clock generator that receives a reference clock at a reference frequency and generates a phase-shifted version of the reference clock;
   a phase detector that is coupled to the clock generator, receives the reference clock, and provides a control signal indicative of a phase difference between the reference clock and the phase-shifted version of the reference clock;
   a control signal smoothing unit that is coupled to the phase detector and provides a fixed-value smoothed control signal; and
   a switch that is coupled to the control signal smoothing unit, the clock generator, and the phase detector, and is operable to switch the clock generator from using the control signal in generating the phase-shifted version of the reference clock to using the smoothed control signal.

17. The system of claim 16 further comprising a controller that is coupled to the control signal smoothing unit and the switch, and is operable to reset the control signal smoothing unit and to control the switch to determine which signal is used by the clock generator.

18. The system of claim 17 wherein:

the clock generator comprises a delay line, the phase detector comprises a digital phase detector, the control signal smoothing unit comprises a digital averaging unit, and the switch comprises a multiplexer.

19. The system of claim 18 wherein:

the clock generator uses the control signal by receiving a sampled version of the control signal during a closed-loop start-up period in which the system achieves lock, and the clock generator then uses the smoothed control signal during an open-loop operational period.

20. The system of claim 16 wherein the control signal smoothing unit comprises a digital averaging unit.

21. A method of providing at least two phases of a reference clock the method comprising:

receiving the reference clock;

phase-shifting the reference clock to produce a phase-shifted reference clock;

synchronizing the reference clock and the phase-shifted reference clock; and removing, from the phase-shifted reference clock, all phase dither attributable to the synchronizing technique while retaining phase-synchronization between the reference clock and the phase-shifted reference clock.

22. The method of claim 21 wherein removing all phase dither comprises:

smoothing, during a closed-loop period of operation, a control signal that is used to determine the amount of phase by which the reference clock is phase-shifted, the smoothing creating a fixed-value smoothed control signal; and during an open loop period of operation, using the fixed-value smoothed control signal instead of the control signal to determine the amount of phase by which the reference clock is phase-shifted.

23. The method of claim 20 wherein:

synchronizing the reference clock and the phase-shifted reference clock comprises using a digital technique, and removing all phase dither from the phase-shifted reference clock removes all phase dither attributable to the digital nature of the synchronizing technique.

24. The method of claim 22 wherein smoothing a control signal comprises averaging a digital control signal to create the fixed-value smoothed control signal.

25. The method of claim 22 wherein smoothing a control signal comprises:

sampling a digital control signal to produce sampled values; and averaging the sampled values to create the fixed-value smoothed control signal.

26. A method of controlling phase of a signal, the method comprising:

providing a control signal indicative of a phase difference between a first signal and a second signal;

controlling phase of the second signal using the control signal;

averaging the control signal over multiple values of the control signal to produce an averaged control signal; and controlling phase of the second signal using the averaged control signal.

27. The method of claim 26 further comprising switching from controlling phase of the second signal using the control signal to controlling phase of the second signal using the averaged control signal.

* * * * *